(12) United States Patent
Kim

(10) Patent No.: US 10,985,007 B2
(45) Date of Patent: Apr. 20, 2021

(54) SUBSTRATE TREATING APPARATUS AND METHOD FOR INSPECTING TREATMENT LIQUID NOZZLE

(71) Applicant: SEMES CO., LTD., Chungcheongnam-do (KR)

(72) Inventor: Kwangsup Kim, Chungcheongnam-do (KR)

(73) Assignee: SEMES CO. LTD., Chungcheongnam-do (KR)

( * ) Notice: Subject to any disclaimer, the term of this patent is extended or adjusted under 35 U.S.C. 154(b) by 0 days.

(21) Appl. No.: 16/157,541

(22) Filed: Oct. 11, 2018

(65) Prior Publication Data

US 2019/0111450 A1 Apr. 18, 2019

(30) Foreign Application Priority Data

Oct. 12, 2017 (KR) .................. 10-2017-0132279

(51) Int. Cl.
| | |
|---|---|
| *H01L 21/02* | (2006.01) |
| *B05C 5/00* | (2006.01) |
| *B05C 11/00* | (2006.01) |
| *H01L 21/67* | (2006.01) |

(52) U.S. Cl.
CPC ........ *H01L 21/02057* (2013.01); *B05C 5/002* (2013.01); *B05C 11/00* (2013.01); *H01L 21/6708* (2013.01); *H01L 21/67051* (2013.01); *H01L 21/67253* (2013.01)

(58) Field of Classification Search
None
See application file for complete search history.

(56) References Cited

U.S. PATENT DOCUMENTS

| | | | |
|---|---|---|---|
| 2001/0011842 A1 | 8/2001 | Rockl et al. | |
| 2008/0100809 A1* | 5/2008 | Nakashima | ......... H01L 21/6715 355/27 |
| 2011/0286738 A1* | 11/2011 | Noda | .................. H01L 21/6715 396/611 |

FOREIGN PATENT DOCUMENTS

| | | |
|---|---|---|
| JP | 2003185466 A | 7/2003 |
| JP | 2014197653 A | 10/2014 |
| KR | 20030059046 A | 7/2003 |
| KR | 20060017655 A | 2/2006 |
| KR | 20160037088 A | 4/2016 |
| KR | 20170103455 A | 9/2017 |

* cited by examiner

*Primary Examiner* — Mikhail Kornakov
*Assistant Examiner* — Ryan L. Coleman
(74) *Attorney, Agent, or Firm* — Carter, DeLuca & Farrell LLP

(57) ABSTRACT

Disclosed are a substrate treating apparatus and a method for inspecting a treatment liquid nozzle. The substrate treating apparatus includes a support member configured to support a substrate, a treatment liquid nozzle configured to discharge a treatment liquid to the substrate located on the support member, a light source configured to irradiate light to a point of the substrate, to which the treatment liquid is discharged, a camera configured to photograph the point of the substrate, to which the treatment liquid is discharged, and a controller configured to determine, through an image captured by the camera, whether a crown is generated when the treatment liquid collides with the substrate.

6 Claims, 5 Drawing Sheets

CR

SUBSTRATE TREATING APPARATUS AND METHOD FOR INSPECTING TREATMENT LIQUID NOZZLE

CROSS-REFERENCE TO RELATED APPLICATIONS

This application claims priority under 35 U.S.C. § 119 to Korean Patent Application No. 10-2017-0132279 filed on Oct. 12, 2017, in the Korean Intellectual Property Office, the disclosures of which are incorporated by reference herein in their entireties.

BACKGROUND

Embodiments of the inventive concept described herein relate to a substrate treating apparatus and a method for inspecting a treatment liquid nozzle.

In order to manufacture a semiconductor device or a liquid crystal display, various processes such as photolithography, etching, ashing, ion implantation, thin film deposition, and cleaning are performed on a substrate. Among them, an etching process is a process of removing an unnecessary area of a thin film formed on a substrate, and requires a high selection ratio and a high etching rate for a thin film. Further, a process of heating a substrate may be accompanied during the above-mentioned process.

In general, in a process of etching or cleaning a substrate, a chemical processing operation, a rinsing operation, and a drying operation are sequentially performed. In the chemical processing operation, a thin film formed on a substrate is etched or a chemical for removing foreign substances on a substrate is supplied to a substrate, and in the rinsing operation, a rinsing liquid such as pure water is supplied onto a substrate. The treatment of the substrate through the fluid may be accompanied by heating of the substrate.

SUMMARY

Embodiments of the inventive concept provide a substrate treating apparatus that may efficiently treat a substrate, and a substrate treating method.

Embodiments of the inventive concept also provide a substrate treating apparatus that may inspect a state of a treatment liquid nozzle and a method for inspecting a treatment liquid nozzle.

In accordance with an aspect of the inventive concept, there is a substrate treating apparatus including a support member configured to support a substrate, a treatment liquid nozzle configured to discharge a treatment liquid to the substrate located on the support member, a light source configured to irradiate light to a point of the substrate, to which the treatment liquid is discharged, a camera configured to photograph the point of the substrate, to which the treatment liquid is discharged, and a controller configured to determine, through an image captured by the camera, whether a crown is generated when the treatment liquid collides with the substrate.

The light source may irradiate light in a form in which the light scatters due to the crown.

The light source may irradiate light such that an incident angle of the light is 5 to 85 degrees with respect to a vertical line.

The controller may detect an amount of the treatment liquid discharged, through a width of the crown.

The controller may detect a discharge angle of the treatment liquid through the center of the crown and the center of an end of the treatment liquid nozzle.

In accordance with another aspect of the inventive concept, there is provided a method for inspecting a treatment liquid nozzle, the method including determining whether a crown is generated when a treatment liquid collides with a substrate, by irradiating light to a point of the substrate, at which the treatment liquid collides with the substrate, and capturing an image in a state in which a treatment liquid nozzle is controlled to discharge the treatment liquid to the substrate.

The light may be irradiated in a form in which the light scatters due to the crown.

The light may be irradiated at an angle of 5 to 85 degrees with respect to a vertical line.

A discharge amount of the treatment liquid may be detected through a width of the crown.

A discharge angle of the treatment liquid may be detected through the center of the crown and the center of an end of the treatment liquid nozzle.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Hereinafter, exemplary embodiments of the inventive concept will be described in more detail with reference to the accompanying drawings. The embodiments of the inventive concept may be modified in various forms, and the scope of the inventive concept should not be construed to be limited to the following embodiments. The embodiments of the inventive concept are provided to describe the inventive concept for those skilled in the art more completely. Accordingly, the shapes of the components of the drawings are exaggerated to emphasize clearer description thereof.

Figure 1:
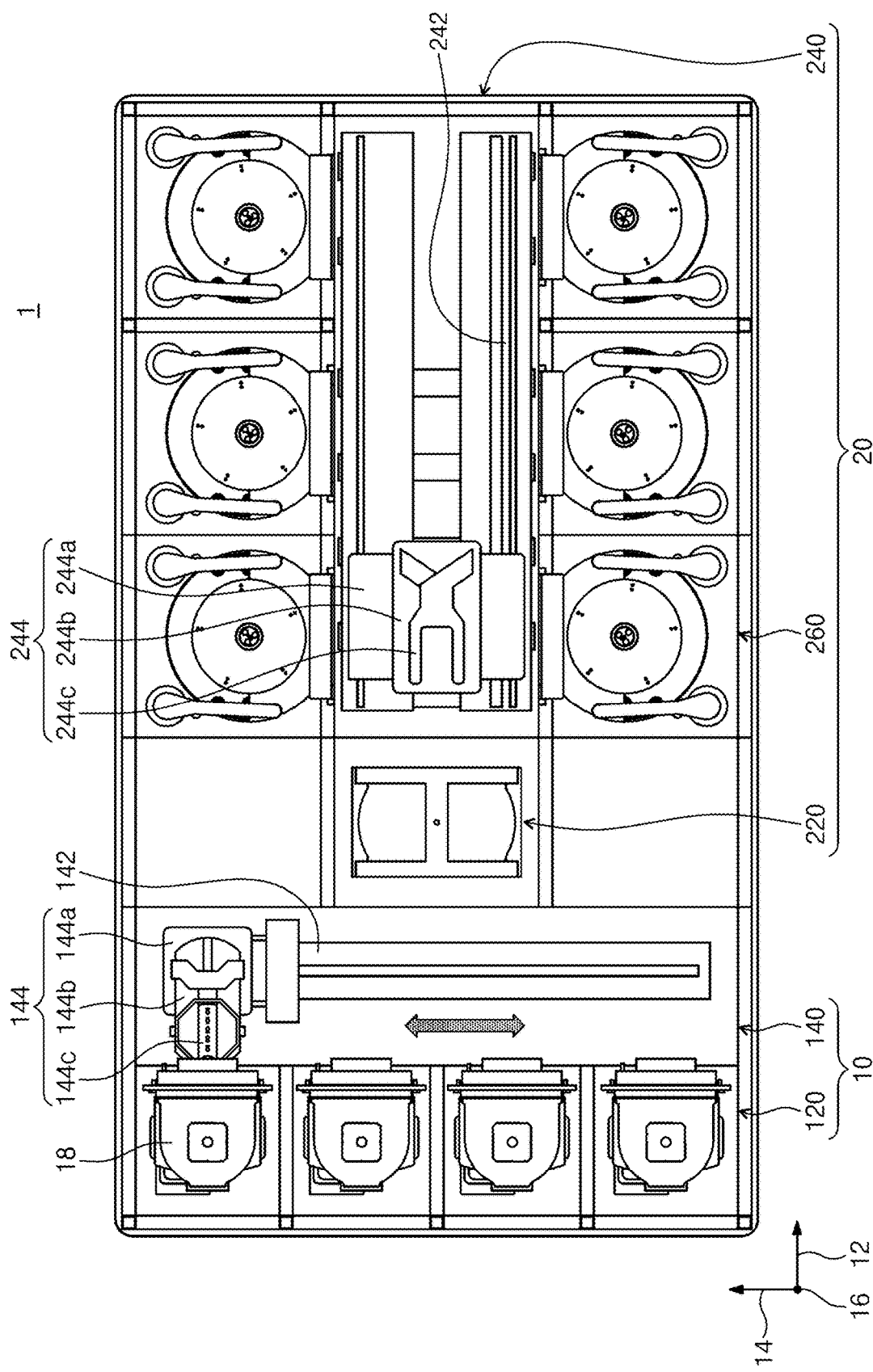
FIG. 1 is a plan view illustrating a substrate treating apparatus according to an embodiment of the inventive concept.

FIG. 1 is a plan view illustrating a substrate treating apparatus according to an embodiment of the inventive concept.

Referring to FIG. 1, the substrate treating apparatus 1 includes an index module 10 and a process executing module 20. The index module 10 includes a plurality of load ports 120 and a feeding frame 140. The load ports 120, the feeding frame 140, and the process executing module 20 may be sequentially arranged in a row. Hereinafter, a direction in which the load ports 120, the feeding frame 140, and the process executing module 20 are arranged will be referred to as a first direction 12, a direction that is perpendicular to the first direction 12 when viewed from the top will be referred to as a second direction 14, and a direction that is normal to a plane containing the first direction 12 and the second direction 14 will be referred to as a third direction 16.

A carrier 18, in which a substrate S is received, is seated on the load port 120. A plurality of load ports 120 are provided, and are arranged along the second direction 14 in a row. However, the number of the load ports 120 may increase or decrease according to a condition, such as the process efficiency of the process executing module 20 or a footprint. A plurality of slots (not illustrated) for receiving substrates W while the substrates S are arranged in parallel to the ground surface are formed in the carrier 18. A front opening unified pod (FOUP) may be used as the carrier 18.

The process executing module 20 includes a buffer unit 220, a feeding chamber 240, and a plurality of process chambers 260. The feeding chamber 240 is disposed such that the lengthwise direction thereof is in parallel to the first direction 12. Process chambers 260 are arranged on opposite sides of the feeding chamber 240. The process chambers 260 are provided on the opposite sides of the feeding chamber 240 to be symmetrical to each other with respect to the feeding chamber 240. A plurality of process chambers 260 are arranged on one side of the feeding chamber 240. Some of the process chambers 260 are arranged along the lengthwise direction of the feeding chamber 240. Furthermore, some of the process chambers 260 are arranged to be stacked on each other. That is, the process chamber 260 having an array of A by B may be arranged on one side of the feeding chamber 240. Here, A is the number of the process chambers 260 provided in a row along the first direction 12, and B is the number of the process chambers 260 provided in a row along the third direction 16. When four or six process chambers 260 are provided on one side of the feeding chamber 240, the process chambers 260 may be arranged in an array of 2 by 2 or 3 by 2. The number of the process chambers 260 may increase or decrease. Unlike the above-mentioned description, the process chambers 260 may be provided only on one side of the feeding chamber 240. Further, the process chambers 260 may be provided on one side or opposite sides of the feeding chamber 240 to form a single layer.

The buffer unit 220 is disposed between the feeding frame 140 and the feeding chamber 240. The buffer unit 220 provides a space in which the substrates S stay before being transported, between the feeding chamber 240 and the feeding frame 140. A plurality of slots (not illustrated) in which the substrates S are positioned are provided in the interior of the buffer unit 220. A plurality of slots (not illustrated) may be provided to be spaced apart from each other along the third direction 16. A face of the buffer unit 220 that faces the feeding frame 140 and a face of the buffer unit 220 that faces the feeding chamber 240 are opened.

The feeding frame 140 transports the substrates S between the carrier 18 seated on the load port 120 and the buffer unit 220. An index rail 142 and an index robot 144 are provided in the feeding frame 140. The index rail 142 is arranged such that the lengthwise direction thereof is in parallel to the second direction 14. The index robot 144 is installed on the index rail 142, and is linearly moved in the second direction 14 along the index rail 142. The index robot 144 has a base 144a, a body 144b, and a plurality of index arms 144c. The base 144a is installed to be moved along the index rail 142. The body 144b is coupled to the base 144a. The body 144b is configured to be moved along the third direction 16 on the base 144a. The body 144b is configured to be rotated on the base 144a. The index arms 144c are coupled to the body 144b, and are configured to be moved forwards and rearwards with respect to the body 144b. A plurality of index arms 144c are configured to be driven individually. The index arms 144c are arranged to be stacked so as to be spaced apart from each other along the third direction 16. Some of the index arms 144c are used when the substrates S are transported to the carrier 18 in the process module 20, and some of the index arms 144c may be used when the substrates S are transported from the carrier 18 to the process executing module 20. This structure may prevent particles generated from the substrates S before the process treatment from being attached to the substrates S after the process treatment in the process of carrying the substrates W in and out by the index robot 144.

The feeding chamber 240 transports the substrates S between the buffer unit 220 and the process chambers 260, and between the process chambers 260. A guide rail 242 and a main robot 244 are provided in the feeding chamber 240. The guide rail 242 is disposed such that the lengthwise direction thereof is parallel to the first direction 12. The main robot 244 is installed on the guide rail 242, and is linearly moved along the first direction 12 on the index rail 242. The main robot 244 has a base 244a, a body 244b, and a plurality of main arms 244c. The base 244a is installed to be moved along the guide rail 242. The body 244b is coupled to the base 244a. The body 244b is configured to be moved along the third direction 16 on the base 244a. The body 244b is configured to be rotated on the base 244a. The main arms 244c are coupled to the body 244b, and are configured to be moved forwards and rearwards with respect to the body 244b. A plurality of main arms 244c are configured to be driven individually. The main arms 244c are arranged to be stacked so as to be spaced apart from each other along the third direction 16.

The process chamber 260 performs a process on the substrate S. The processes performed in the process chamber 260 are the same, but may be two or more different processes.

Figure 2:
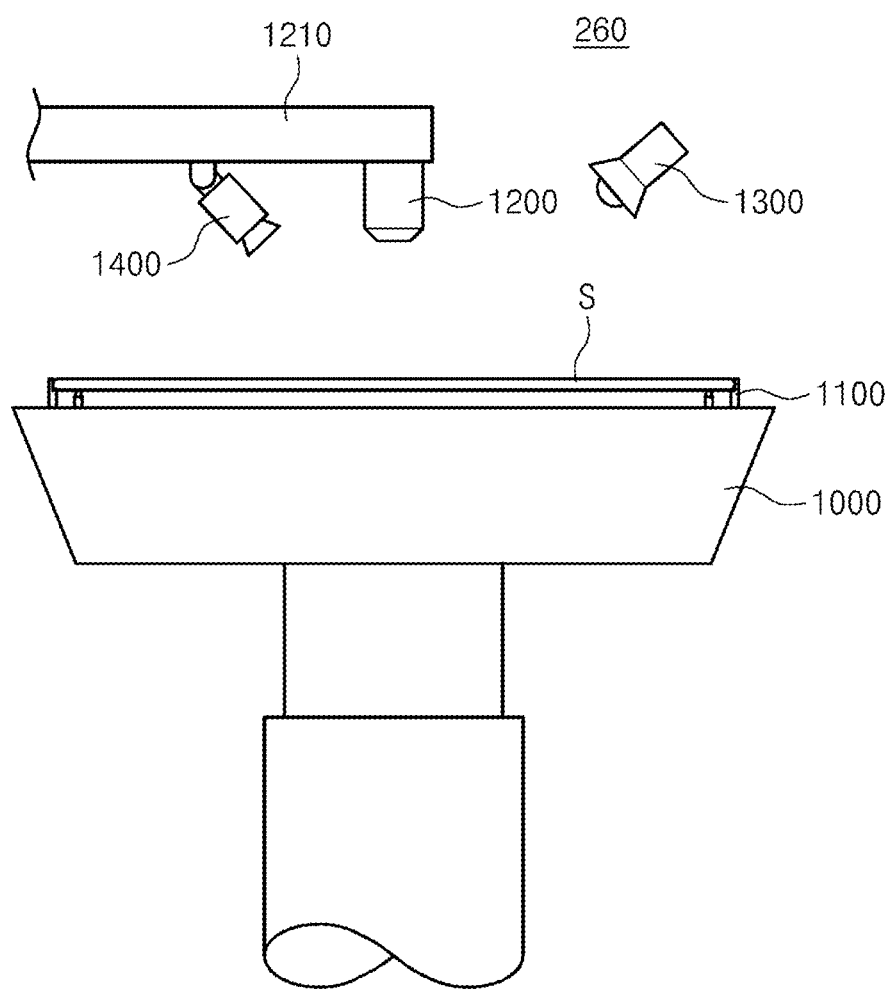
FIG. 2 is a view illustrating a process chamber according to an embodiment of the inventive concept.

FIG. 2 is a view illustrating a process chamber according to an embodiment of the inventive concept.

Referring to FIG. 2, the process chamber 260 includes a support member 1000, a treatment liquid nozzle 1200, a light source 1300, a camera 1400, and a controller.

The support member 1000 supports the substrate S during execution of a process. The support member 1000 is provided such that an upper surface of the support member 1000 has a preset area. As an example, the support member 1000 may have an area that is larger than that of a substrate S, and may support the substrate S in a state in which a bottom surface of the substrate S is spaced apart from the upper surface of the support member 1000, by supporting the substrate S with a pin 1100 provided on the upper surface of the support member 1000. Further, the support member 1000 may be provided such that the upper surface of the support member 1000 has an area that is larger or smaller than that of the substrate S, and may be configured to fix the substrate S in a scheme of vacuum-suctioning the substrate S. The support member 1000 may be configured to be rotatable, and may rotate the substrate S during execution of the process.

The treatment liquid nozzle 1200 discharges a treatment liquid for treating the substrate S, which is located on the support member 1000, to the substrate S. The treatment liquid may be phosphoric acid. Further, the treatment liquid may be a chemical, such as a sulfuric acid ($H_2SO_4$), a nitric acid ($HNO_3$), and ammonia ($NH_3$). Further, the treatment liquid may be deionized water or isopropyl alcohol (IPA) liquid.

The light source 1300 irradiates light of a wavelength of a preset band to the substrate S. The light is irradiated to a point at which the treatment liquid discharged from the treatment liquid nozzle 1200 is applied to the substrate S. Then, the light may include a point at which the treatment liquid is applied to the substrate S and a lower end of a nozzle located above the point.

The camera 1400 is configured to photograph an area, to which light is irradiated by the light source 1300. As an example, the camera 1400 may be configured to be located in a nozzle arm 1210 that supports the treatment liquid nozzle 1200.

The controller is configured to control elements of the substrate treating apparatus. The controller controls the light source 1300 such that the light is irradiated at a preset time point. The controller may be provided to analyze a state of an image captured by the camera 1400.

Figure 3:
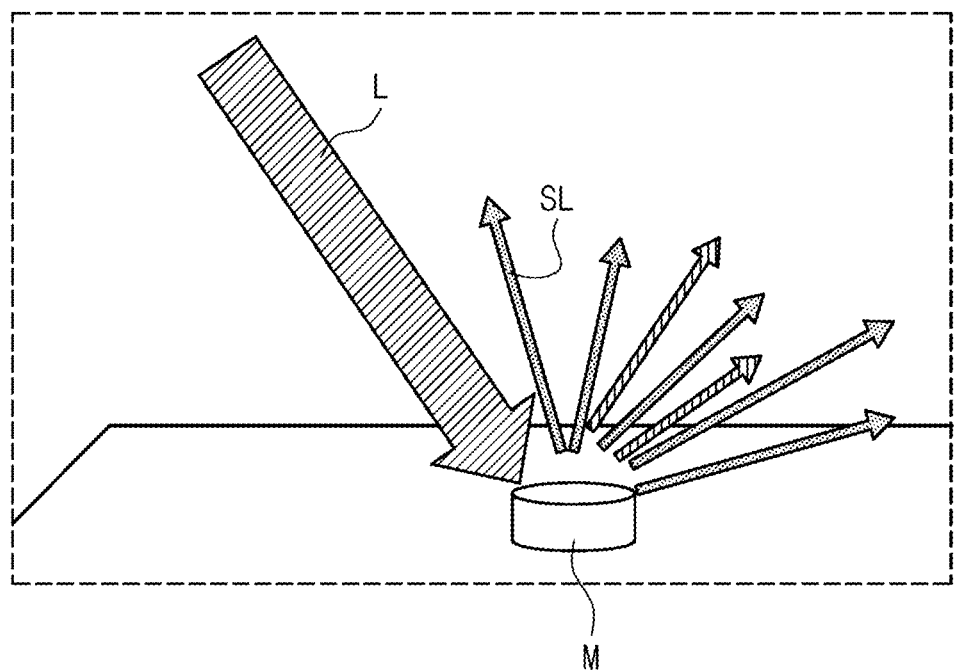
FIG. 3 is a view illustrating a principle of capturing an image with a camera by using a light source.
Figure 4:
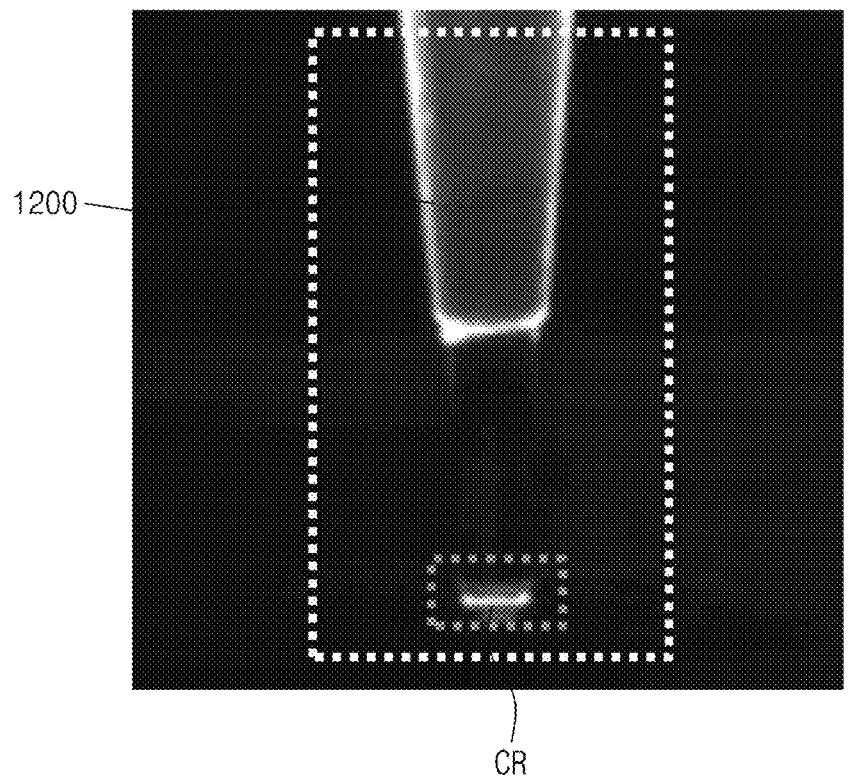
FIG. 4 is a view illustrating an image captured by a camera in a state in which a treatment liquid is discharged.
Figure 5:
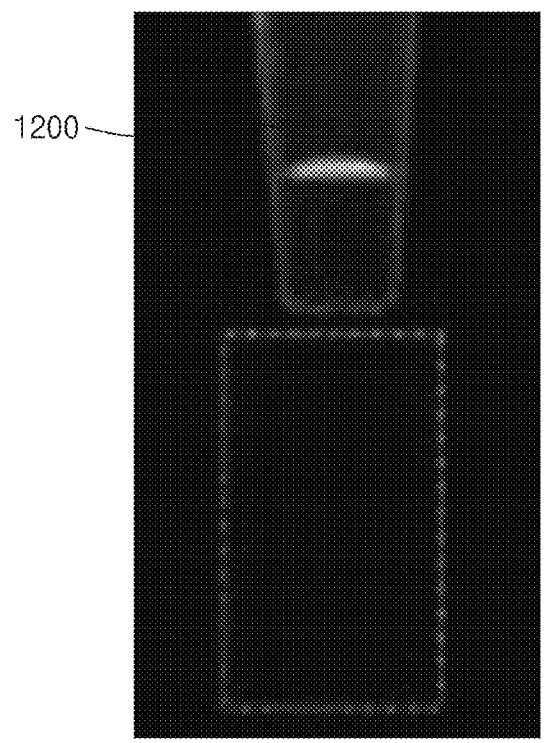
FIG. 5 is a view illustrating an image captured by a camera in a state in which a treatment liquid is not discharged.

FIG. 3 is a view illustrating a principle of capturing an image with a camera by using a light source. FIG. 4 is a view illustrating an image captured by a camera in a state in which a treatment liquid is discharged. FIG. 5 is a view illustrating an image captured by a camera in a state in which a treatment liquid is not discharged.

Referring to FIGS. 3 to 5, the scattering level (SL) of the irradiated light L increases if a state of a material location M located in the travel direction of the light L is unstable. Meanwhile, because the treatment liquid is a liquid, the light source 1300 has a sufficient transmitting property. Accordingly, if the light source 1300 irradiates light to a point at which the treatment liquid is discharged in a state in which the treatment liquid nozzle 1200 discharges the treatment liquid and the camera 1400 perform photographing, the treatment liquid in an area in which the treatment liquid collides with the substrate S is photographed while having a clearer image (hereinafter, a crown CR) as compared with the treatment liquid that proceeds to the substrate S after being discharged. Further, the clarity of the crown CR in the image is improved by adjusting an angle by which the light 1300 irradiates light to a present range. Accordingly, the light source 1300 irradiates light such that an angle between a vertical line that is set upwards at a point of the substrate S, to which the treatment liquid is discharged, and an incident angle of the light is set to 5 to 85 degrees when a vertical line is set to be upwards from a point of the substrate S at which the treatment liquid is discharged.

If a crown CR is identified in the image captured by the camera 1400 as in FIG. 4 after the treatment liquid nozzle 1200 is controlled to discharge the treatment liquid, the controller may determine that the treatment liquid nozzle 1200 is normally operated to discharge the treatment liquid. If a crown CR is not identified in the image captured by the camera 1400 as in FIG. 5 after the treatment liquid nozzle 1200 is controlled to discharge the treatment liquid, the controller may determine that the treatment liquid nozzle 1200 is not normally operated.

Figure 6:
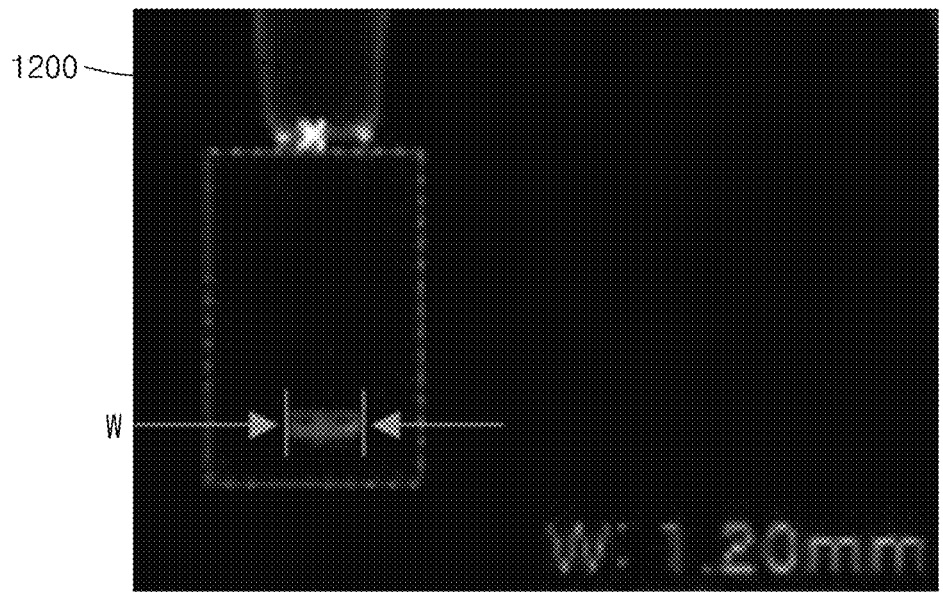
FIG. 6 is an image illustrating a method for determining an amount of a treatment liquid discharged, through an image.

FIG. 6 is an image illustrating a method for determining an amount of a treatment liquid discharged, through an image.

Referring to FIG. 6, the controller may determine through an image captured by the camera 1400 whether an amount of the treatment liquid discharged is within a preset range together with whether the treatment liquid is discharged.

An amount of the treatment liquid discharged by the treatment liquid nozzle 1200 per unit time for efficient treatment of the substrate S needs to be controlled to a preset amount or a preset range (hereinafter, a preset amount). Accordingly, the treatment nozzle 1200 may be in a preset state in which a preset amount of the treatment liquid is discharged. Further, the controller may control the treatment liquid nozzle 1200 to discharge the preset amount of treatment liquid. If the amount of the treatment liquid discharged by the treatment liquid nozzle 1200 per unit time increases, a discharge speed of the treatment liquid increases or a cross-sectional area of the treatment liquid discharged increases so that the size of the crown CR generated when the treatment liquid collides with the substrate S increases. Meanwhile, if the amount of the treatment liquid discharged by the treatment liquid nozzle 1200 per unit time decreases, a discharge speed of the treatment liquid decreases or a cross-sectional area of the treatment liquid discharged decreases so that the size of the crown CR generated when the treatment liquid collides with the substrate S decreases. Accordingly, the controller may detect whether the amount of the treatment liquid discharged satisfies the preset amount through a width W of the captured crown CR. That is, if the width W of the captured crown CR is larger than a preset width W, the controller may determine that the amount of the treatment liquid discharged is larger than the present amount. That is, if the width W of the captured crown CR is smaller than a preset width W, the controller may determine that the amount of the treatment liquid discharged is smaller larger than the present amount.

Figure 7:
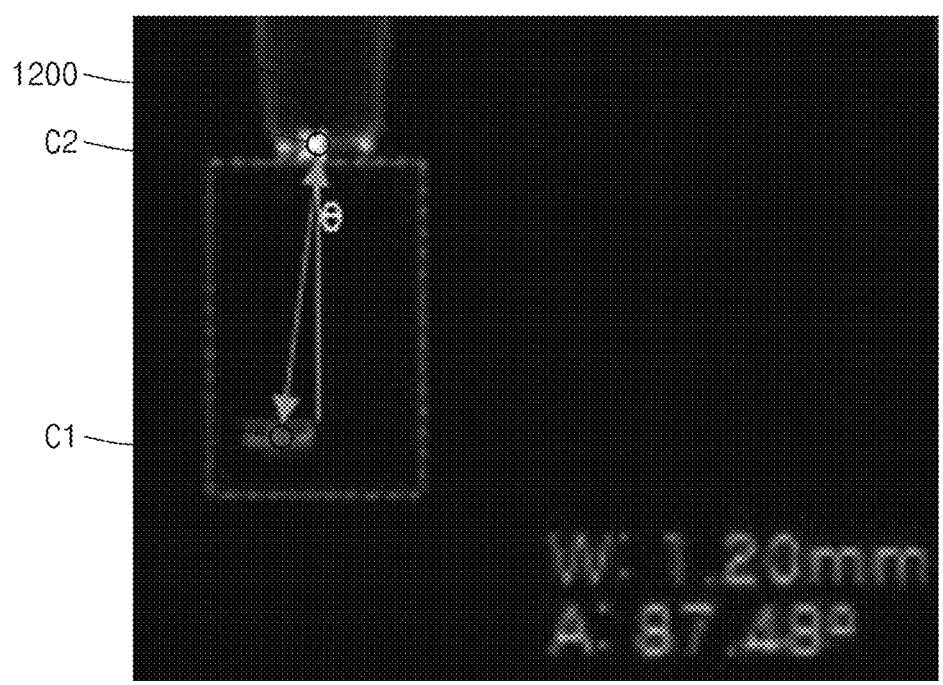
FIG. 7 is an image illustrating a method for determining a direction of a treatment liquid discharged, through an image.

FIG. 7 is an image illustrating a method for determining a direction of a treatment liquid discharged, through an image.

Referring to FIG. 7, the controller may determine through an image captured by the camera 1400 whether a discharge direction of the treatment liquid faces a preset direction together with whether the treatment liquid is discharged.

For efficient treatment of the substrate S, the discharge direction of the treatment liquid needs to be controlled to face the preset direction. For example, in order to prevent the treatment liquid discharged to the substrate S from spattering irregularly or from being spread out unevenly according to a direction of the treatment liquid, the treatment liquid needs to be controlled to be discharged from an end of the nozzle toward a vertical lower side.

If the crown CR is identified, the controller may calculate the center C1 of the crown CR through locations of opposite ends of the crown CR. Further, the controller may calculate a discharge direction of the treatment liquid discharged, through an angle θ between the center C1 of the crown CR and the center C2 of an end of the treatment nozzle 1200. Then, the camera 1400 may be configured to photograph an end of the treatment nozzle 1200, and the controller may calculate the center C2 of the end of the treatment nozzle 1200 through the image. Further, the camera 1400 may be installed such that the captured image and the end of the treatment nozzle 1200 have a preset locational relationship, and the controller may determine that the center of the end of the treatment liquid nozzle 1200 is located in the image or a preset point outside the image regardless of whether the camera 1400 photographs the end of the treatment nozzle 1200.

According to an embodiment of the inventive concept, a substrate treating apparatus that efficiently treats a substrate and a substrate treating method may be provided.

Further, according to an embodiment of the inventive concept, a substrate treating apparatus that may inspect a state of a treatment liquid nozzle and a method for inspecting a treatment nozzle may be provided.

The above description exemplifies the inventive concept. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, it should be construed that the attached claims include other embodiments.

What is claimed is:

1. A method for inspecting a treatment liquid nozzle used to discharge treatment liquid onto a substrate, the method comprising:

irradiating light to a predetermined point of the substrate;

discharging, by the treatment liquid nozzle, the treatment liquid at a predetermined point on the substrate;

capturing a colliding shape in an image, by a camera, wherein the colliding shape is formed when the treatment liquid collides with the substrate;

determining a discharge amount of the treatment liquid based on a width of the colliding shape, wherein the determining of the discharge amount is performed by a controller configured to automatically analyze image data from the camera;

adjusting the discharge amount of the treatment liquid nozzle based on the width of the colliding shape;

calculating an angle between a line, which connects a center of the colliding shape and a center of an end of the treatment liquid nozzle, and a vertical line, wherein the calculating of the angle is performed by the controller; and adjusting a discharging direction of the treatment liquid from the treatment liquid nozzle based on the angle and a preset locational relationship between the camera and the treatment liquid nozzle.

2. The method of claim 1, wherein the colliding shape is captured due to the irradiated light.

3. The method of claim 2, wherein the light is irradiated at an angle of 5 to 85 degrees with respect to the vertical line.

4. The method of claim 1, wherein the treatment liquid nozzle is controlled to discharge a preset amount of the treatment liquid.

5. The method of claim 1, wherein the camera is installed such that the captured image and the end of the treatment liquid nozzle have the preset locational relationship.

6. The method of claim 5, wherein the center of the end of the treatment liquid nozzle is determined based on the preset locational relationship regardless of whether the captured image does not include the end of the treatment liquid nozzle.

* * * * *